United States Patent
Chen et al.

(10) Patent No.: US 10,971,223 B2
(45) Date of Patent: Apr. 6, 2021

(54) PHASE CHANGE MEMORY OPERATION METHOD AND CIRCUIT

(71) Applicant: TAIWAN SEMICONDUCTOR MANUFACTURING COMPANY, LTD., Hsinchu (TW)

(72) Inventors: Yu-Sheng Chen, Hsinchu (TW); Jau-Yi Wu, Hsinchu (TW); Chia-Wen Chang, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 16/547,106

(22) Filed: Aug. 21, 2019

(65) Prior Publication Data

US 2020/0105342 A1 Apr. 2, 2020

Related U.S. Application Data

(60) Provisional application No. 62/738,953, filed on Sep. 28, 2018.

(51) Int. Cl.
*G11C 13/00* (2006.01)
*G06N 3/063* (2006.01)

(52) U.S. Cl.
CPC ....... *G11C 13/0004* (2013.01); *G06N 3/0635* (2013.01); *G11C 13/004* (2013.01); *G11C 2013/0045* (2013.01); *G11C 2213/30* (2013.01); *G11C 2213/52* (2013.01)

(58) Field of Classification Search
CPC .............. G11C 13/0004; G11C 13/004; G11C 2213/30; G11C 2213/52; G11C 2013/0045; G11C 11/54; G11C 13/0064; G11C 2013/009; G11C 2013/0092; G11C 2013/0078; G11C 13/0069
See application file for complete search history.

(56) References Cited

U.S. PATENT DOCUMENTS 8,618,524 B2 12/2013 Liang et al.
9,064,572 B2 6/2015 Liu et al.
9,214,229 B2 * 12/2015 Cheng ................ G11C 13/0069
(Continued)

FOREIGN PATENT DOCUMENTS

| KR | 20100132975 A | 12/2010 |
|---|---|---|
| KR | 20120000487 A | 1/2012 |
| WO | 2009114200 A1 | 9/2009 |

OTHER PUBLICATIONS

Office Action dated Jul. 27, 2020 from corresponding application No. TW 108134726.
(Continued)

*Primary Examiner* — Mohammed A Bashar
(74) *Attorney, Agent, or Firm* — Hauptman Ham, LLP

(57) ABSTRACT

A method includes applying a pulse sequence to a PCM device, each pulse of the pulse sequence including a pulse number, an amplitude, a leading edge, a pulse width, and a trailing edge, the trailing edge having a duration longer than a duration of the leading edge. Applying the pulse sequence includes increasing the pulse number while increasing at least one of the amplitude, the pulse width, or the trailing edge duration. A conductance level of the PCM device is altered in response to applying the pulse sequence.

20 Claims, 8 Drawing Sheets

(56) References Cited

U.S. PATENT DOCUMENTS

| | | |
|---|---|---|
| 2009/0231912 A1 | 9/2009 | Liu |
| 2011/0317480 A1* | 12/2011 | Lung ................. G11C 13/0004 365/163 |
| 2016/0125287 A1 | 5/2016 | Pantazi et al. |
| 2016/0224890 A1 | 8/2016 | Friedman et al. |
| 2019/0067570 A1 | 2/2019 | Tsai et al. |
| 2019/0221277 A1* | 7/2019 | Reznicek ........... H01L 21/0245 |

OTHER PUBLICATIONS

Office Action dated Oct. 16, 2020 for corresponding case No. KR 10-20100132975. (pp. 1-6).
Office Action dated Jan. 13, 2021 for corresponding case No. TW 11020038280. (pp. 1-9).

* cited by examiner

PHASE CHANGE MEMORY OPERATION METHOD AND CIRCUIT

PRIORITY CLAIM

The present application claims the priority of U.S. Provisional Application No. 62/738,953, filed Sep. 28, 2018, which is incorporated herein by reference in its entirety.

BACKGROUND

Phase-change memory (PCM) devices have resistance values that are altered by transitioning some or all of a material volume between a low-resistance crystalline phase and a high-resistance amorphous phase. In memory cell applications, targeted resistance values are usually divided into two groups corresponding to low and high logic levels.

In analog synapse applications, targeted resistance values typically include more than the two groups sufficient for memory cell applications. Analog synapse applications often include synapse arrays in which PCM devices act as weighting factors in layers of neural networks, e.g., multilayer perceptron (MLP) neural networks.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
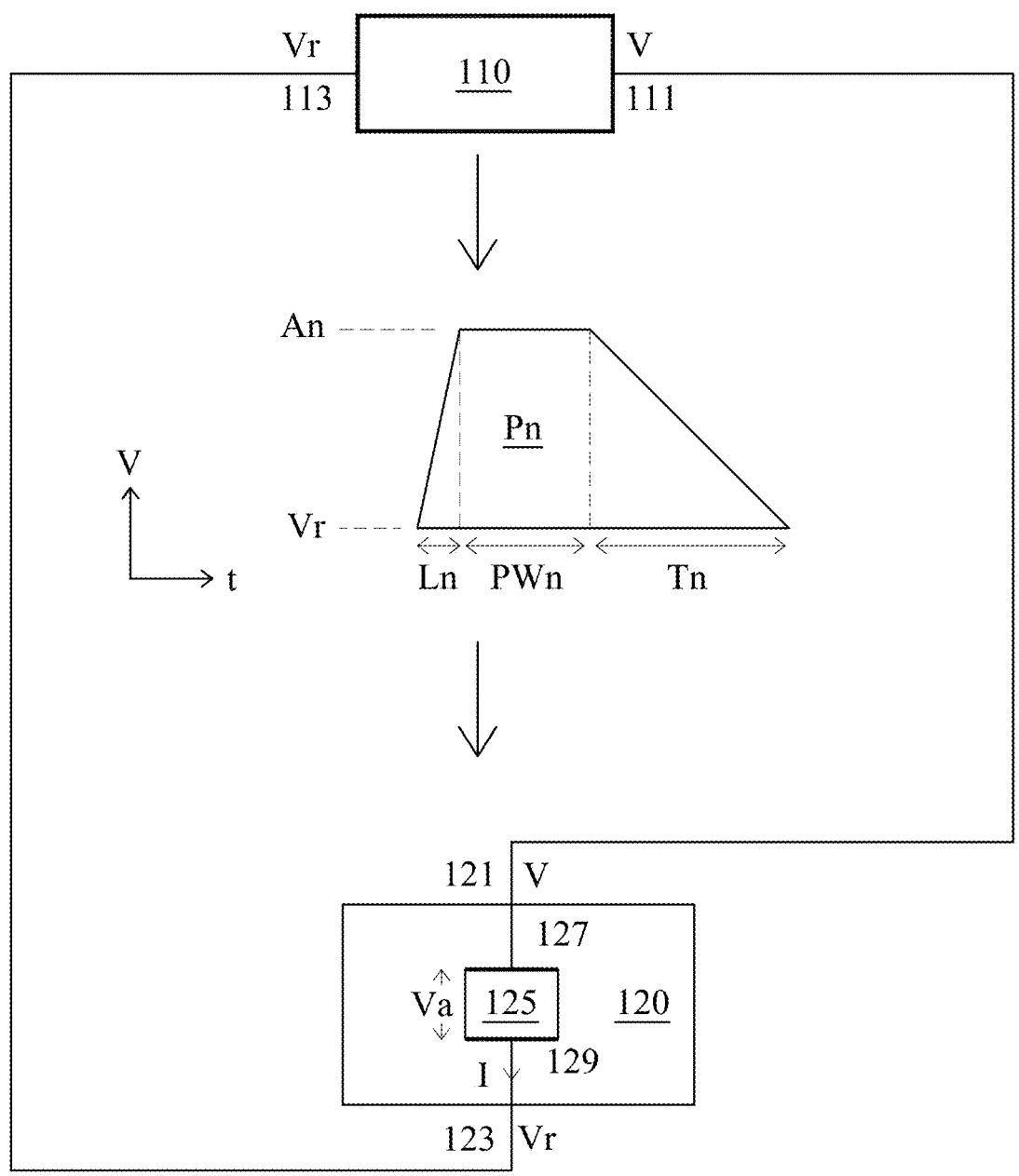
FIG. 1 is a diagram of a PCM circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, crystalline/amorphous phase-based conductance values of a PCM device are controlled in a PCM circuit by applying a sequence of pulses including trailing edge durations longer than leading edge durations. Particularly in resetting operations in which crystalline and amorphous phases are controlled so that conductance is decreased toward a lowest conductance value, applying the sequence of pulses enables improved control of conductance values compared to approaches in which a sequence of pulses does not include a trailing edge duration longer than a leading edge duration.

FIG. 1 is a diagram of a PCM circuit 100, in accordance with some embodiments. FIG. 1 depicts PCM circuit 100 including a pulse generation circuit 110, a PCM device 120, and a pulse Pn. Pulse generation circuit 110 includes a terminal 111 coupled to a terminal 121 of PCM device 120, and a terminal 113 coupled to a terminal 123 of PCM device 120. Pulse generation circuit 110 is configured to output a sequence of pulses Pn ($1 \leq n \leq N$) on terminals 111 and 113, the pulse sequence having the number of pulses N.

Two or more circuit elements are considered to be coupled based on a direct electrical connection or an electrical connection that includes one or more additional circuit elements and is thereby capable of being controlled, e.g., made resistive or open by a transistor or other switching device.

Pulse generation circuit 110 is one or more electronic and/or electromechanical circuits configured to generate and output the sequence of pulses Pn having the voltage and timing characteristics discussed below. In various embodiments, pulse generation circuit 110 includes one or more of a processing device, e.g., a processor 702 discussed below with respect to FIG. 7, a signal processing circuit, a logic device, a PCM device in addition to PCM device 120, or another circuit suitable for generating output pulses Pn.

In some embodiments, PCM circuit 100 is some or all of a neural network, and pulse generation circuit 110 includes an analog synapse array, e.g. a synapse array 310 discussed below with respect to FIG. 3.

PCM device 120 is an electronic or electromechanical device including a material layer 125 positioned between electrodes 127 and 129 configured to receive an applied voltage Va. In some embodiments, in addition to material layer 125 and electrodes 127 and 129, PCM device 120 includes a heating structure (not shown) positioned between or adjacent to electrodes 127 and 129.

Material layer 125 includes one or more layers of one or more resistive materials, also referred to as PCM materials in some embodiments, capable of transitioning between a low-resistance crystalline phase and a high-resistance amorphous phase. In various embodiments, material layer 125 includes one or more of a chalcogenide material, e.g., germanium-antimony-tellurium (GeSbTe or GST), GeTe, GeSb, or $Sb_2Te_3$, or other suitable phase-change material, and, in some embodiments, one or more dopants, e.g., nitrogen (N), oxygen (O), carbon (C), indium (In), silicon (Si), tin (Sn), gallium (Ga), arsenic (As), selenium (Se), or other suitable dopant materials.

In various embodiments, electrodes 127 and 129 are planar, arranged in parallel, and have a same size and a same shape, e.g., a pillar arrangement of a PCM device 400A discussed below with respect to FIG. 4A. In various embodiments, electrodes 127 and 129 are planar, arranged in parallel, and have differing sizes and/or shapes, e.g., a mushroom arrangement of a PCM device 400B discussed below with respect to FIG. 4B. In various embodiments, electrodes 127 and 129 are otherwise configured, e.g., having concave or other nonplanar geometries, arranged in a non-parallel relationship, and/or having non-continuous shapes, such that material layer 125 is positioned between electrodes 127 and 129.

In various embodiments, electrodes 127 and 129 include one or more of tungsten (W), copper (Cu), aluminum (Al), aluminum-copper, or other suitable conductive materials.

In the embodiment depicted in FIG. 1, electrodes 127 and 129 are electrically connected to respective terminals 121 and 122 such that applied voltage Va corresponds to a difference between a voltage V received at electrode 127 and a reference voltage Vr received at electrode 129.

In various embodiments, PCM device 120 includes one or more circuit elements (not shown) coupled between electrode 127 and terminal 121 and/or between electrode 129 and terminal 123, material layer 125 thereby being coupled in series with the one or more circuit elements between terminals 121 and 122. In such embodiments, applied voltage Va corresponds to the difference between voltage V and reference voltage Vr reduced by one or more voltage drops across the one or more circuit elements. In various embodiments, the one or more circuit elements include one or more of a selection device, e.g., a transistor or other switching device or a diode, or a resistive device, e.g., a metal resistor.

In operation, PCM device 120 is thereby configured to generate a current I through material layer 125 responsive to applied voltage Va such that a resistance value of material layer 125 is measurable based on values of applied voltage Va and current I. In some embodiments, electrodes 127 and 129 are configured to receive applied voltage Va responsive to one or more signals, e.g., a selection signal, received by the one or more circuit elements in series with material layer 125 or by one or more circuit elements otherwise configured to selectively provide applied voltage Va across electrodes 127 and 129.

In operation, responsive to sufficiently large values of applied voltage Va, current I flowing through material layer 125 and the heating structure, if present, induces self-heating, thereby causing an elevation in temperature. PCM device 120 is thereby configured to control a temperature range of material layer 125 responsive to a range of values of applied voltage Va.

The one or more materials of material layer 125 are configured to transition, at least in part, between a low-resistance crystalline phase and a high-resistance amorphous phase based on one or more temperature values within the temperature range controllable by applied voltage Va. In operation, a transition between the two phases is based on an initial phase type and a duration of one more temperatures within a range corresponding to forming the other phase type, i.e., melting the crystalline phase to form the amorphous phase or crystallizing the crystalline phase from the amorphous phase. Accordingly, at a specific time and at a given location within an overall volume of material layer 125, the corresponding local volume of material is in one of the two phases based on a present temperature, a recent temperature history, and the initial phase type based on a phase history prior to the recent temperature history. In some embodiments, a recent temperature history corresponds to a length of a pulse waveform, e.g., pulse Pn, of applied voltage Va.

PCM device 120 is thereby configured such that portions of the overall volume are controllable by applied voltage Va to be in either one of the two phases, material layer 125 thereby being capable of having a range of phase configurations. The geometry and extent of the range of phase configurations are a function of the composition and geometry of material layer 125, and of the arrangement, e.g., presence of a heating structure, and geometry of the specific embodiment of PCM device 120.

A given phase configuration corresponds to a ratio of one or more volumes of material layer 125 in the crystalline phase to one or more volumes of material layer 125 in the amorphous phase. A lowest value of the ratio corresponds to a smallest volume of the crystalline phase and thereby a lowest conductance value of material layer 125, and a highest value of the ratio corresponds to a largest volume of the crystalline phase and thereby a highest conductance value of material layer 125.

In some embodiments, lowest ratio and conductance values correspond to a fully-amorphous material layer 125 and highest ratio and conductance values correspond to a fully-crystalline material layer 125. In various embodiments, lowest ratio and conductance values correspond to at least a portion of material layer 125 being in the crystalline phase, and/or highest ratio and conductance values correspond to at least a portion of material layer 125 being in the amorphous phase.

In some embodiments, PCM device 120 corresponds to a specific analog synapse in an analog synapse array, e.g. a synapse 320 in synapse array 310 discussed below with respect to FIG. 3, and the ratio and conductance values correspond to a weight of the specific analog synapse.

A temperature profile within material layer 125 is a function of the arrangement and geometry of the specific embodiment of PCM device 120, the value of applied voltage Va, the present phase configuration, and temperature profile and phase configuration histories at the time applied voltage Va is applied. Thus, at a given time, the temperature profile within material layer 125 is a function of the presently applied voltage Va, the recent temperature history as determined by the recent history of applied voltage Va, and the phase configuration prior to the recent histories of temperature and applied voltage Va.

In PCM circuit 100, in operation, the presently applied and recent history of applied voltage Va correspond to a given pulse Pn of the sequence of pulses Pn, and the phase configuration of material layer 125 prior to the recent temperature and applied voltage Va histories is determined, at least in part, by the sequence of pulses Pn prior to the given pulse Pn. Accordingly, local temperature-based phase transitions leading to phase configuration changes in material layer 125 are a function of voltage and timing characteristics of the given pulse Pn and of the portion of the sequence of pulses Pn prior to the given pulse Pn.

FIG. 1 depicts a representative one of the sequence of pulses Pn. The representation of FIG. 1 is simplified for the purpose of illustration, and does not include irregularities associated with non-ideal circuit elements, e.g., distortions due to rectification, bandwidth limitations, parasitic capacitance, resistance, or inductance, or the like.

Each pulse Pn is a signal having voltage V that varies over a time t between reference voltage Vr and an amplitude An relative to reference voltage Vr. In various embodiments, reference voltage Vr has a fixed value, e.g., a ground reference or other direct current (DC) level, or a variable value, e.g., a DC voltage capable of having one of multiple values as determined by one or more operating conditions.

A leading edge of pulse Pn has a leading edge duration Ln corresponding to a time over which voltage V transitions from reference voltage Vr to amplitude An; a pulse width PWn of pulse Pn corresponds to a time over which voltage V remains at amplitude An; and a trailing edge of pulse Pn has a trailing edge duration Tn corresponding to a time over which voltage V transitions from amplitude An to reference voltage Vr. Trailing edge duration Tn is longer than leading edge duration Ln.

In the embodiment depicted in FIG. 1, the voltage and timing characteristics of pulse Pn discussed above are defined at terminal pair 111/113 of pulse generation circuit 110, and at terminal pair 121/123 of PCM device 120. In various embodiments, one or more of the voltage and timing characteristics of pulse Pn are defined at one or more locations other than terminal pairs 111/113 and/or 121/123, e.g., at electrodes 127 and 129 or one or more internal nodes (not shown) of pulse generation circuit 110 and/or PCM device 120.

Amplitude An has one or more values corresponding to controlling the phase configuration of material layer 125. In various embodiments, the one or more values correspond to values of applied voltage Va or to relatively larger values from which the values of applied voltage Va are derived, as discussed above with respect to reducing voltage V relative to reference voltage Vr to realize applied voltage Va.

In various embodiments, sequence of pulses Pn includes each pulse Pn having a same value of amplitude An or at least one value of amplitude An different from one or more other values of amplitude An. In some embodiments, amplitude An has one or more values ranging from 0.5 volts (V) to 10 V. In some embodiments, amplitude An has one or more values ranging from 1 V to 6 V.

Leading edge duration Ln has one or more values corresponding to speeds at which voltage V having amplitude An is provided to PCM device 120 in PCM circuit 100. In some embodiments, PCM circuit 100 is configured in accordance with a minimum speed specification, and leading edge duration Ln has one or more values at or below a maximum duration corresponding to the minimum speed.

In various embodiments, sequence of pulses Pn includes each pulse Pn having a same value of leading edge duration Ln or at least one value of leading edge duration Ln different from one or more other values of leading edge duration Ln. In some embodiments, leading edge duration Ln is based on a constant slope of the leading edge of pulse Pn such that the value of leading edge duration Ln is a function of the value of amplitude An. In some embodiments, leading edge duration Ln has one or more values ranging from 1 nanosecond (ns) to 100 ns. In some embodiments, leading edge duration Ln has one or more values ranging from 5 ns to 20 ns.

Pulse width PWn has one or more values corresponding to controlling the phase configuration of material layer 125 based on amplitude An. In various embodiments, sequence of pulses includes each pulse Pn having a same value of pulse width PWn or at least one value of pulse width PWn different from one or more other values of pulse width PWn. In some embodiments, pulse width PWn has one or more values ranging from 10 ns to 1000 ns. In some embodiments, pulse width PWn has one or more values ranging from 50 ns to 200 ns. In some embodiments, pulse width PWn has one or more values ranging from 80 ns to 120 ns.

Trailing edge duration Tn has one or more values corresponding to controlling the phase configuration of material layer 125 based on amplitude An. In some embodiments, the one or more values of trailing edge duration Tn are based on a crystallization temperature of a material of material layer 125. In various embodiments, trailing edge duration Tn has the one or more values that increase with increasing crystallization temperature of the material of material layer 125.

In various embodiments, sequence of pulses Pn includes each pulse Pn having a same value of trailing edge duration Tn or at least one value of trailing edge duration Tn different from one or more other values of trailing edge duration Tn. In some embodiments, trailing edge duration Tn has one or more values ranging from 10 ns to 1000 ns. In some embodiments, trailing edge duration Tn has one or more values ranging from 50 ns to 200 ns. In some embodiments, trailing edge duration Tn has one or more values ranging from 75 ns to 125 ns.

In some embodiments, sequence of pulses Pn includes each pulse Pn having same values of each of amplitude An, leading edge duration Ln, pulse width PWn, and trailing edge duration Tn, or at least one value of one or more of amplitude An, leading edge duration Ln, pulse width PWn, or trailing edge duration Tn different from one or more other values of the one or more of amplitude An, leading edge duration Ln, pulse width PWn, or trailing edge duration Tn. In various embodiments, sequence of pulses Pn includes one of pulse sequences 200A-200D discussed below with respect to FIGS. 2A-2D.

By including trailing edge duration Tn longer than leading edge duration Ln, sequence of pulses Pn is capable of controlling a phase configuration of material layer 125 based at least in part on trailing edge duration Tn relative to leading edge duration Ln. Particularly in resetting operations in which the ratio of the phase configuration of material layer 125 is decreased toward the lowest conductance value, applying sequence of pulses Pn including trailing edge duration Tn longer than leading edge duration Ln enables improved phase configuration control compared to approaches in which a sequence of pulses does not include a trailing edge duration longer than a leading edge duration.

FIGS. 2A-2D are diagrams of respective pulse sequences 200A-200D, in accordance with some embodiments. As discussed below, pulse sequence 200A includes identical pulses Pn, pulse sequence 200B includes pulses Pn in which values of amplitude An increase with increasing pulse number, pulse sequence 200C includes pulses Pn in which values of pulse width PWn increase with increasing pulse number, and pulse sequence 200D includes pulses Pn in which values of trailing edge duration Tn increase with increasing pulse number.

Figure 2A:
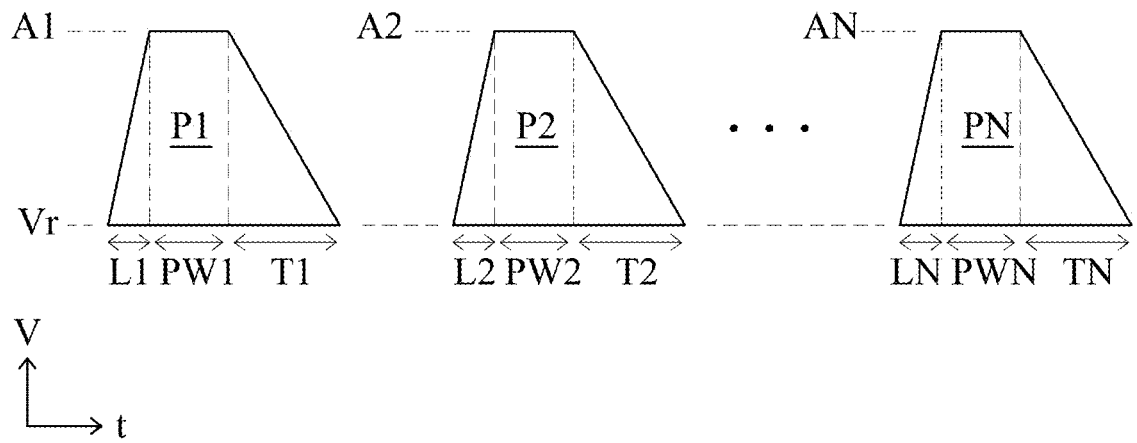
FIGS. 2A-2D are diagrams of pulse sequences, in accordance with some embodiments.

FIG. 2A depicts pulses Pn of pulse sequence 200A corresponding to pulse numbers n=1, 2, and N. As depicted in FIG. 2A, pulses P1, P2, and PN have same values of each of amplitudes A1, A2, and AN, leading edge durations L1, L2, and LN, pulse widths PW1, PW2, and PWN, and trailing edge durations T1, T2, and TN for respective pulse numbers n=1, 2, and N. Pulses Pn of pulse sequence 200A thereby have a waveform independent of pulse number n.

Figure 2B:
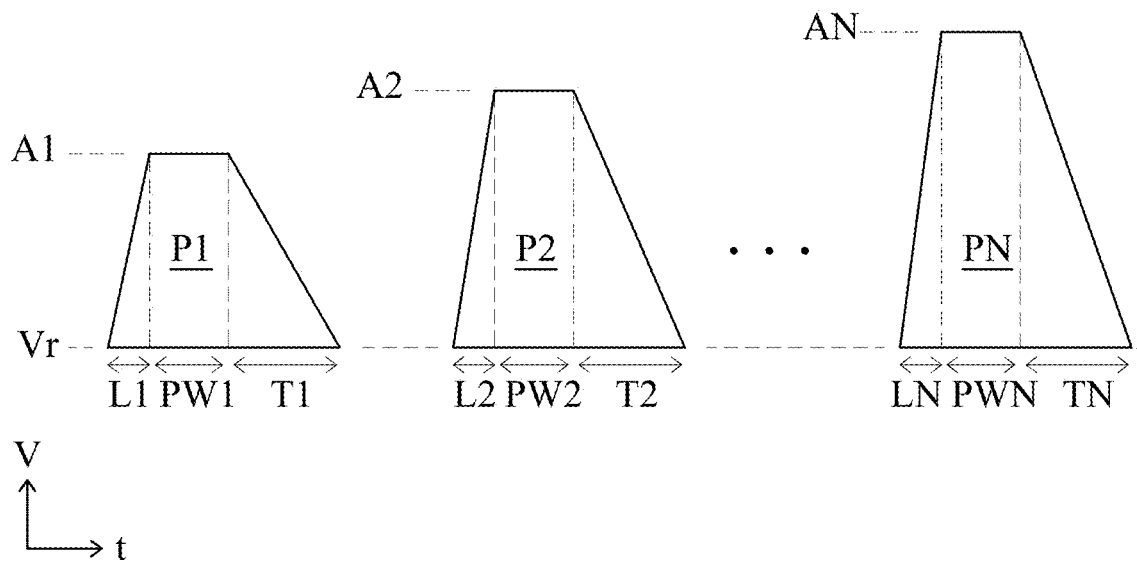

FIG. 2B depicts pulses Pn of pulse sequence 200B corresponding to pulse numbers n=1, 2, and N. As depicted in FIG. 2B, pulses P1, P2, and PN have same values of each of leading edge durations L1, L2, and LN, pulse widths PW1, PW2, and PWN, and trailing edge durations T1, T2, and TN for respective pulse numbers n=1, 2, and N. Pulses Pn of pulse sequence 200B have amplitudes A1, A2, and AN that increase in value with increasing pulse number n.

In some embodiments, values of amplitude An increase linearly with increasing pulse number n such that, for each pair of consecutive pulse numbers n of pulse sequence 200B, a difference in values of amplitudes An is the same. In various embodiments, values of amplitudes An have one or more relationships to pulse number n of pulse sequence 200B other than linear by which the values of amplitude An increase with increasing pulse number n.

Figure 2C:
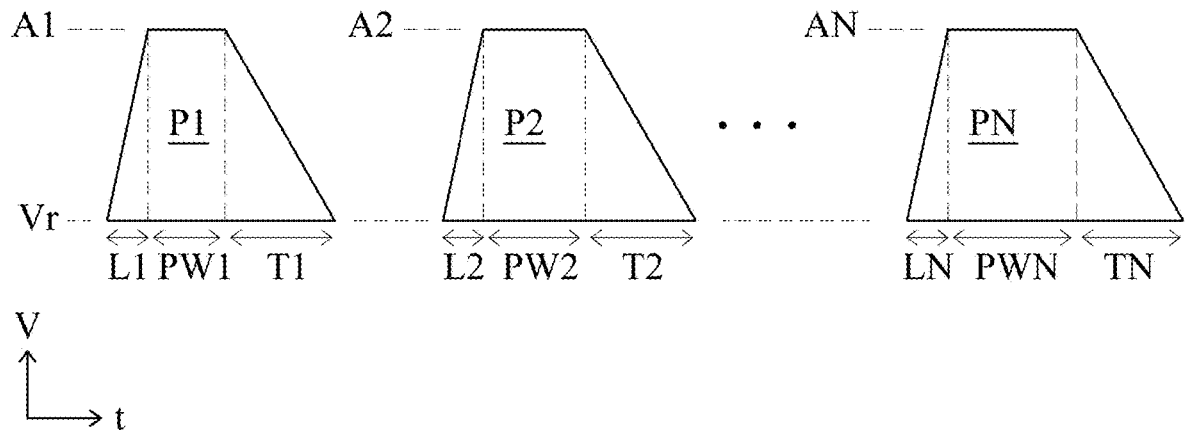

FIG. 2C depicts pulses Pn of pulse sequence 200C corresponding to pulse numbers n=1, 2, and N. As depicted in FIG. 2C, pulses P1, P2, and PN have same values of each of amplitudes A1, A2, and AN, leading edge durations L1, L2, and LN, and trailing edge durations T1, T2, and TN for respective pulse numbers n=1, 2, and N. Pulses Pn of pulse sequence 200C have pulse widths PW1, PW2, and PWN that increase in value with increasing pulse number n.

In some embodiments, values of pulse width PWn increase linearly with increasing pulse number n such that, for each pair of consecutive pulse numbers n of pulse sequence 200C, a difference in values of pulse widths PWn is the same. In various embodiments, values of pulse widths PWn have one or more relationships to pulse number n of pulse sequence 200C other than linear by which the values of pulse width PWn increase with increasing pulse number n.

Figure 2D:
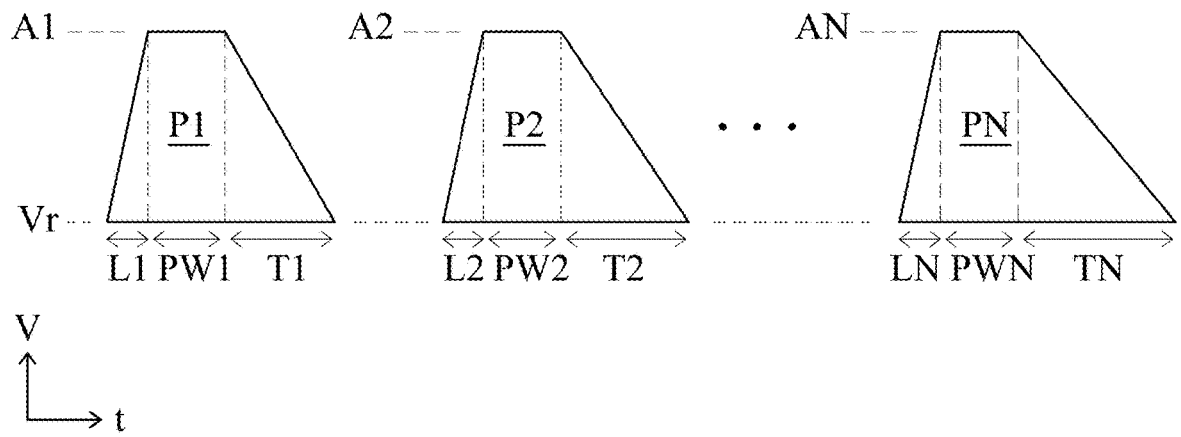

FIG. 2D depicts pulses Pn of pulse sequence 200D corresponding to pulse numbers n=1, 2, and N. As depicted in FIG. 2D, pulses P1, P2, and PN have same values of each of amplitudes A1, A2, and AN, leading edge durations L1, L2, and LN, and pulse widths PW1, PW2, and PWN for respective pulse numbers n=1, 2, and N. Pulses Pn of pulse sequence 200D have trailing edge durations T1, T2, and TN that increase in value with increasing pulse number n.

In some embodiments, values of trailing edge duration Tn increase linearly with increasing pulse number n such that, for each pair of consecutive pulse numbers n of pulse sequence 200D, a difference in values of trailing edge durations Tn is the same. In various embodiments, values of trailing edge durations Tn have one or more relationships to pulse number n of pulse sequence 200D other than linear by which the values of trailing edge duration Tn increase with increasing pulse number n.

In each of the embodiments discussed above, pulse sequences 200A-200D include pulses Pn having trailing edge durations Tn longer than leading edge durations Ln, thereby obtaining the benefits discussed above with respect to sequence of pulses Pn.

Figure 3:
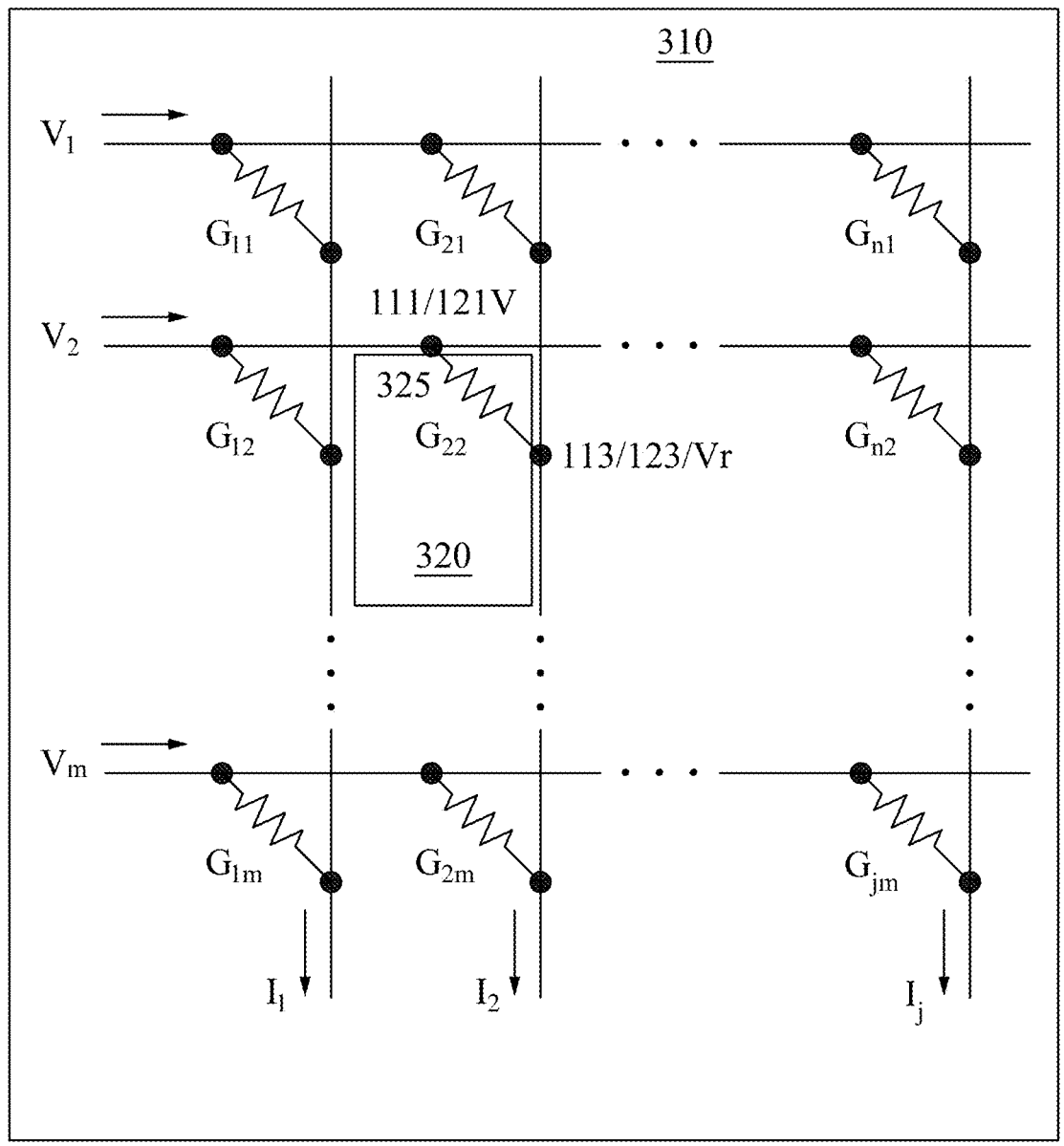
FIG. 3 is a diagram of a neural network layer, in accordance with some embodiments.

FIG. 3 is a diagram of a neural network layer 300, in accordance with some embodiments. Neural network layer 300 is usable as PCM circuit 100, and includes synapse array 310 usable as pulse generation circuit 110 and synapse 320 usable as PCM device 120, each discussed above with respect to FIG. 1. Synapse array 310 includes terminals 111 and 113 coupled to respective terminals 121 and 123 of synapse 320 and is thereby configured to provide sequence of pulses Pn as voltage V relative to reference voltage Vr, discussed above with respect to FIG. 1.

Neural network layer 300 is some or all of a layer of a neural network, e.g., an MLP neural network, in which each of one or more layers is configured to perform one or more matrix computations on data signals, the one or more matrix computations including applying weights to some or all of the data signals. In various embodiments, neural network layer 300 is some or all of a hidden layer or an output layer of the neural network.

Neural network layer 300 includes a number m of rows corresponding to voltage signals V1-Vm and a number j of columns corresponding to current signals I1-Ij. Each intersection of a row and a column includes a PCM device configured as an analog synapse represented in FIG. 3 as a resistor coupled between the corresponding row and column. Each resistor has a conductance Gjm corresponding to the weight of the analog synapse such that a given current signal Ij is the sum of currents based on each voltage signal V1-Vm multiplied by a respective conductance Gj1-Gjm.

In the non-limiting example depicted in FIG. 3, synapse 320 includes resistor 325 coupled between row 2 and column 2 having conductance G22, and synapse array 310 includes the remaining synapses in neural network layer 300. The synapses in synapse array 310 are configured to, in operation, generate sequence of pulses Pn at terminals 111/121 and 113/123, thereby controlling a phase configuration and conductance G22 of resistor 325 in the manner discussed above with respect to FIG. 1. In various embodiments, synapse 320 corresponds to a resistor coupled elsewhere within neural network layer 300 and synapse array 310 corresponds to the remaining synapses accordingly.

In some embodiments, synapse array 310 includes one or more circuits (not shown) in addition to the remaining synapses and is thereby configured to generate sequence of pulses Pn at terminals 111/121 and 113/123. In some embodiments, synapse 320 includes one or more circuit elements (not shown) in addition to resistor 325 such that sequence of pulses Pn is selectively applied to resistor 325 responsive to one or more control signals. In some embodiments, synapse array 310 and/or synapse 320 include one or more terminals (not shown) in addition to terminals 111/121 and 113/123 such that sequence of pulses Pn is applied to resistor 325 through electrical connections separate from those through which synapse 320 is integrated with synapse array 310.

By being configured to control conductance G22 of resistor 325 of synapse 320 by applying sequence of pulses Pn having trailing edge durations Tn longer than leading edge durations Ln, neural network layer 300 is capable of realizing the benefits discussed above with respect to sequence of pulses Pn.

Figure 4A:
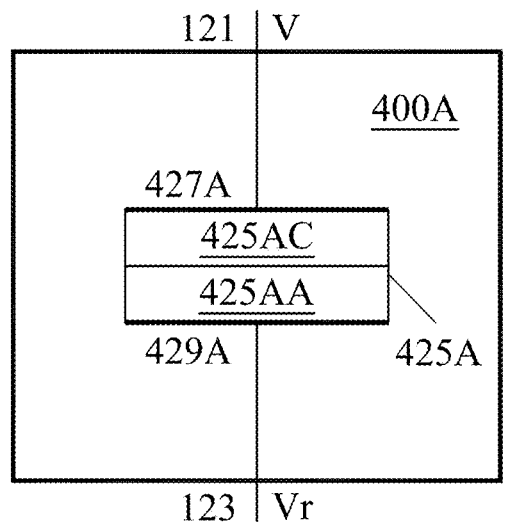
FIGS. 4A and 4B are diagrams of PCM devices, in accordance with some embodiments.
Figure 4B:
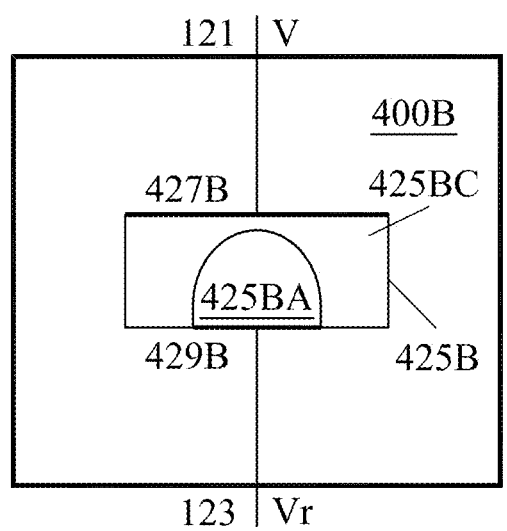

FIGS. 4A and 4B are diagrams of respective PCM devices 400A and 400B, in accordance with some embodiments. Each of PCM devices 400A and 400B is usable as PCM device 120, includes terminals 121 and 123, and is thereby configured to receive sequence of pulses Pn as voltage V relative to reference voltage Vr, discussed above with respect to FIG. 1. Each of FIGS. 4A and 4B depicts a non-limiting example of a PCM device and is simplified for the purpose of illustration, e.g., by including only a cross-sectional representation based on a single plane.

As depicted in FIG. 4A, PCM device 400A includes an electrode 427A electrically connected to terminal 121, an electrode 429A electrically connected to terminal 123, and a material layer 425A positioned between electrodes 427A and 429A. Material layer 425A includes a portion 425AC having the crystalline phase and a portion 425AA having the amorphous phase as discussed above with respect to PCM device 120 and FIG. 1.

Electrodes 427A and 429A are planar, arranged in parallel, and have a same size and a same shape (not shown), thereby having a pillar arrangement. Accordingly, portions 425AC and 425AA extend uniformly between electrodes 427A and 429A, and thereby have relative volumes corresponding to a phase distribution of PCM device 400A.

As depicted in FIG. 4B, PCM device 400B includes an electrode 427B electrically connected to terminal 121, an electrode 429B electrically connected to terminal 123, and a material layer 425B positioned between electrodes 427B and 429B. Material layer 425B includes a portion 425BC having the crystalline phase and a portion 425BA having the amorphous phase as discussed above with respect to PCM device 120 and FIG. 1.

Electrodes 427B and 429B are planar, arranged in parallel, and electrode 429B is smaller than electrode 427B, electrodes 427B and 429B thereby having an arrangement referred to as a mushroom arrangement in some embodiments. Accordingly, portion 425BA extends across electrode 429B and portion 425BC extends across electrode 427B and surrounds some or all of portion 425BA. Portions 425BC and 425BA thereby have relative volumes corresponding to a phase distribution of PCM device 400B.

By being configured to control phase distributions, and thereby conductance, of material layers 425A and 425B, by applying sequence of pulses Pn having trailing edge durations Tn longer than leading edge durations Ln, a PCM circuit, e.g., PCM circuit 100 discussed above with respect to FIG. 1, including a respective one of PCM devices 400A or 400B is capable of realizing the benefits discussed above with respect to sequence of pulses Pn.

Figure 5:
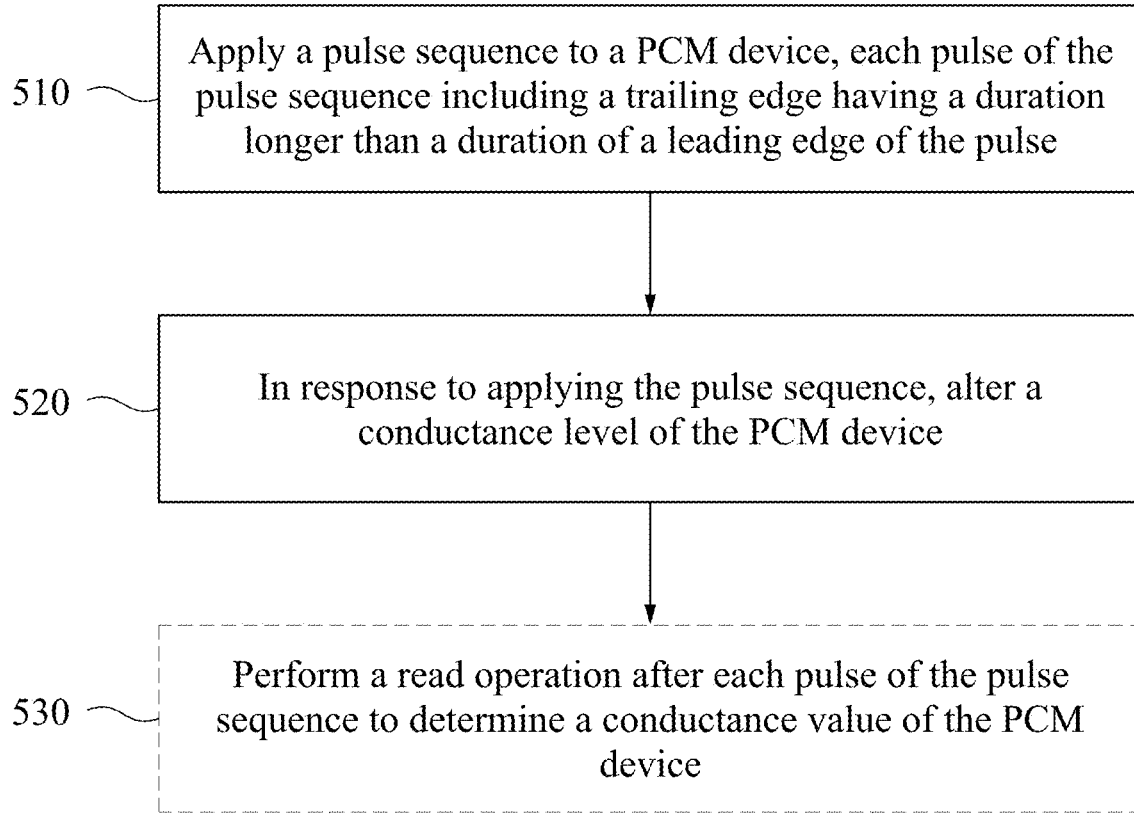
FIG. 5 is a flowchart of a method of altering a conductance of a PCM device, in accordance with some embodiments.

FIG. 5 is a flowchart of a method 500 of altering a conductance of a PCM device, in accordance with some embodiments. In some embodiments, altering the conductance of the PCM device includes altering the conductance of PCM device 120 discussed above with respect to FIG. 1.

In some embodiments, some or all of method 500 is executed by a processor of a computer. In some embodiments, some or all of method 500 is executed by processor 702 of pulse generation system 700, discussed below with respect to FIG. 7.

In some embodiments, the operations of method 500 are performed in the order depicted in FIG. 5. In some embodiments, the operations of method 500 are performed simultaneously and/or in an order other than the order depicted in FIG. 5. In some embodiments, one or more operations are performed before, between, during, and/or after performing one or more operations of method 500.

At operation 510, a pulse sequence is applied to a PCM device, each pulse of the pulse sequence including a trailing edge having a duration longer than a duration of a leading edge of the pulse. In some embodiments, each pulse of the pulse sequence also includes a pulse number, an amplitude, and a pulse width, and applying the pulse sequence includes increasing the pulse number while increasing at least one of the amplitude, the pulse width, or the trailing edge duration.

In some embodiments, applying the pulse sequence includes applying sequence of pulses Pn discussed above with respect to FIG. 1. In some embodiments, applying the pulse sequence includes applying one of pulse sequences 200A-200D discussed above with respect to respective FIGS. 2A-2D.

In some embodiments, increasing the at least one of the amplitude, the pulse width, or the trailing edge duration includes increasing amplitude An discussed above with respect to FIGS. 1-2D. In some embodiments, increasing the at least one of the amplitude, the pulse width, or the trailing edge duration includes increasing the amplitude linearly with respect to the pulse number.

In some embodiments, increasing the at least one of the amplitude, the pulse width, or the trailing edge duration includes increasing pulse width PWn discussed above with respect to FIGS. 1-2D. In some embodiments, increasing the at least one of the amplitude, the pulse width, or the trailing edge duration includes increasing the pulse width linearly with respect to the pulse number.

In some embodiments, increasing the at least one of the amplitude, the pulse width, or the trailing edge duration includes increasing trailing edge duration Tn discussed above with respect to FIGS. 1-2D. In some embodiments, increasing the at least one of the amplitude, the pulse width, or the trailing edge duration includes increasing the trailing edge duration linearly with respect to the pulse number.

In some embodiments, applying the pulse sequence to the PCM device includes generating the pulse sequence with a pulse generation circuit. In some embodiments, generating the pulse sequence with the pulse generation circuit includes generating the pulse sequence with pulse generation circuit 110 discussed above with respect to FIG. 1.

In some embodiments, generating the pulse sequence with the pulse generation circuit includes generating the pulse sequence with an analog synapse array. In some embodiments, generating the pulse sequence with the pulse generation circuit includes generating the pulse sequence with analog synapse array 310 discussed above with respect to FIG. 3.

In some embodiments, generating the pulse sequence with the pulse generation circuit includes defining the pulse sequence using a processor. In some embodiments, defining the pulse sequence using a processor includes defining the pulse sequence using processor 702 discussed below with respect to FIG. 7.

In some embodiments, generating the pulse sequence with the pulse generation circuit includes using a processor to cause a pulse generation circuit to apply the pulse sequence to the PCM device. In some embodiments, causing the pulse generation circuit to apply the pulse sequence to the PCM device includes using processor 702 discussed below with respect to FIG. 7.

In some embodiments, applying the pulse sequence to the PCM device includes applying the pulse sequence to an analog synapse. In some embodiments, applying the pulse sequence to the analog synapse includes applying the pulse sequence to analog synapse 320 discussed above with respect to FIG. 3.

In some embodiments, applying the pulse sequence to the PCM device includes applying the pulse sequence to a material layer of the PCM device. In some embodiments, applying the pulse sequence to the PCM device includes applying the pulse sequence to material layer 125 of PCM device 120 discussed above with respect to FIG. 1. In some embodiments, applying the pulse sequence to the PCM device includes applying the pulse sequence to material layer 425A of PCM device 400A or material layer 425B of PCM device 400B discussed above with respect to respective FIGS. 4A and 4B.

In some embodiments, applying the pulse sequence includes applying each pulse having the corresponding trailing edge duration corresponding to a crystallization temperature of the material layer. In some embodiments, applying each pulse having the corresponding trailing edge duration corresponding to the crystallization temperature of the material layer includes defining the corresponding trailing edge duration using a processor. In some embodiments, defining the corresponding trailing edge duration using a processor includes using processor 702 discussed below with respect to FIG. 7.

At operation 520, in response to applying the pulse sequence, a conductance level of the PCM device is altered. In some embodiments, altering the conductance level of the PCM device includes lowering the conductance level of the PCM device. In some embodiments, altering the conductance level of the PCM device includes altering the conductance level of PCM device 120 discussed above with respect to FIG. 1.

In some embodiments, altering the conductance level of the PCM device includes altering a phase configuration of a material layer of the PCM device. In some embodiments, altering the phase configuration includes decreasing a value of a ratio of a crystalline phase of a material layer to an amorphous phase of the material layer.

In some embodiments, altering the conductance level of the PCM device includes altering the phase configuration of material layer 125 discussed above with respect to FIG. 1. In some embodiments, altering the conductance level of the PCM device includes altering the phase configuration of material layer 425A of PCM device 400A or material layer 425B of PCM device 400B discussed above with respect to respective FIGS. 4A and 4B.

In some embodiments, altering the conductance level of the PCM device includes altering a weight of an analog synapse. In some embodiments, altering the weight of the analog synapse includes altering the weight of synapse 320 discussed above with respect to FIG. 3.

At operation 530, in some embodiments, a read operation is performed after each pulse of the pulse sequence to determine a conductance value of the PCM device. In some embodiments, performing the read operation includes characterizing the PCM device. In some embodiments, characterizing the PCM device includes determining a relationship between increasing pulse numbers and decreasing conductance values.

In some embodiments, performing the read operation includes obtaining a measurement value of a current through the PCM device in response to a voltage applied to the PCM device. In some embodiments, performing the read operation includes obtaining a measurement value of current I in response to applied voltage Va discussed above with respect to PCM device 120 and FIG. 1.

By executing some or all of the operations of method 500, a conductance level of a PCM device is altered by applying a sequence of pulses having trailing edge durations longer than leading edge durations, thereby controlling the PCM device conductance level so as to realize the benefits discussed above with respect to sequence of pulses Pn.

Figure 6A:
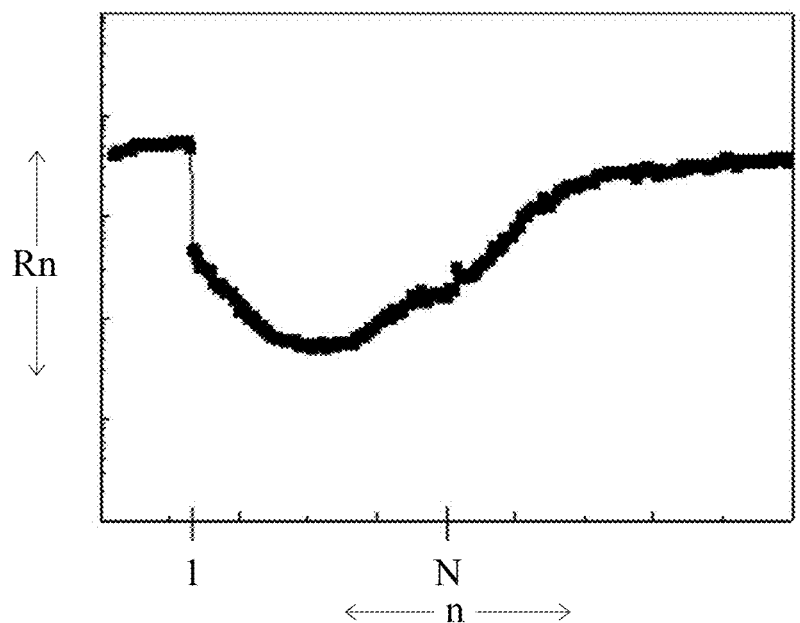
FIGS. 6A and 6B depict PCM device operating parameters, in accordance with some embodiments.
Figure 6B:
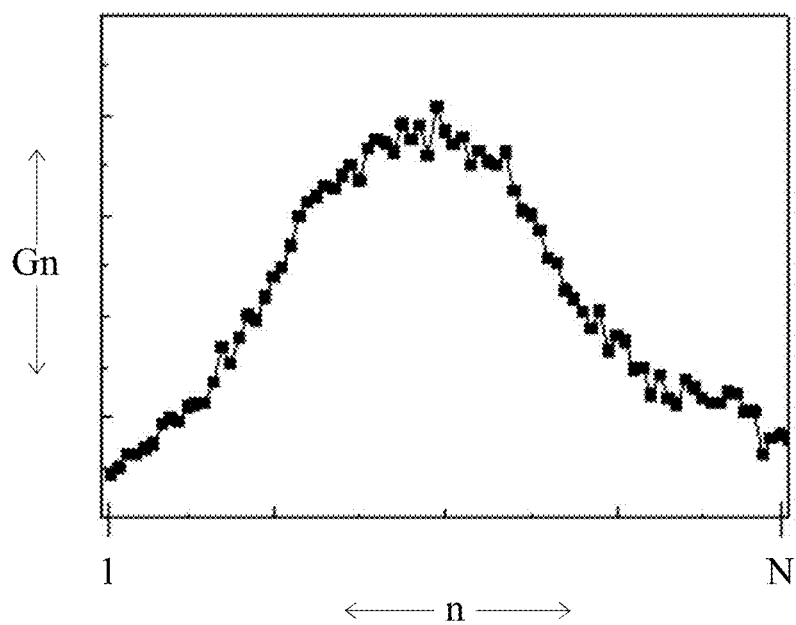

FIGS. 6A and 6B depict PCM device operating parameters, in accordance with some embodiments. Each of FIGS. 6A and 6B includes a horizontal axis corresponding to pulse number n including values ranging from 1 to number of pulses N, and a vertical axis corresponding to a property (discussed below) of material layer 125 of PCM device 120, each discussed above with respect to sequence of pulses Pn and FIGS. 1-2D. In some embodiments, the PCM device operating parameters depicted in FIGS. 6A and 6B correspond to characterization data obtained by executing some or all of method 500 discussed above with respect to FIG. 5.

In the non-limiting example depicted in FIGS. 6A and 6B, sequence of pulses Pn corresponds to pulse sequence 200B in which values of amplitude An increase with increasing pulse number n, discussed above with respect to FIG. 2B. Accordingly, increasing pulse number n along the horizontal axis corresponds to increasing values of amplitude An (not shown in FIGS. 6A and 6B) of pulse Pn along the horizontal axis. In some embodiments, PCM device operating parameters include increasing pulse number n along the horizontal axis corresponding to increasing values of pulse width PWn or trailing edge duration Tn of pulse Pn, discussed above with respect to respective FIGS. 2C and 2D.

FIG. 6A depicts material layer 125 resistance values Rn as a function of pulse number n, with resistance values Rn plotted on a logarithmic scale. As depicted in FIG. 6A, application of first pulse P1 having amplitude A1 corresponding to pulse number n=1 is associated with a decrease in resistance value R1 from resistance values Rn prior to application of first pulse P1. Application of pulses Pn corresponding to increasing pulse number n and amplitude An for n=2 through n=N is associated with continued decreases in resistance values Rn followed by increases in resistance values Rn.

FIG. 6B depicts material layer 125 conductance values Gn as a function of pulse number n, with conductance values Gn plotted on a linear scale. As depicted in FIG. 6B, application of pulses Pn corresponding to increasing pulse number n and amplitude An for n=1 through n=N is associated with initial increases in conductance values Gn followed by decreases in conductance values Gn, the distribution of conductance levels Gn as a function of pulse number n thereby having an approximately symmetrical shape.

Particularly with respect to the decreases in conductance values Gn, FIGS. 6A and 6B illustrate the ability to control conductance levels of a PCM device, e.g., PCM device 120, by applying sequence of pulses Pn including trailing edge duration Tn longer than leading edge duration Ln, discussed above with respect to FIG. 1.

Figure 7:
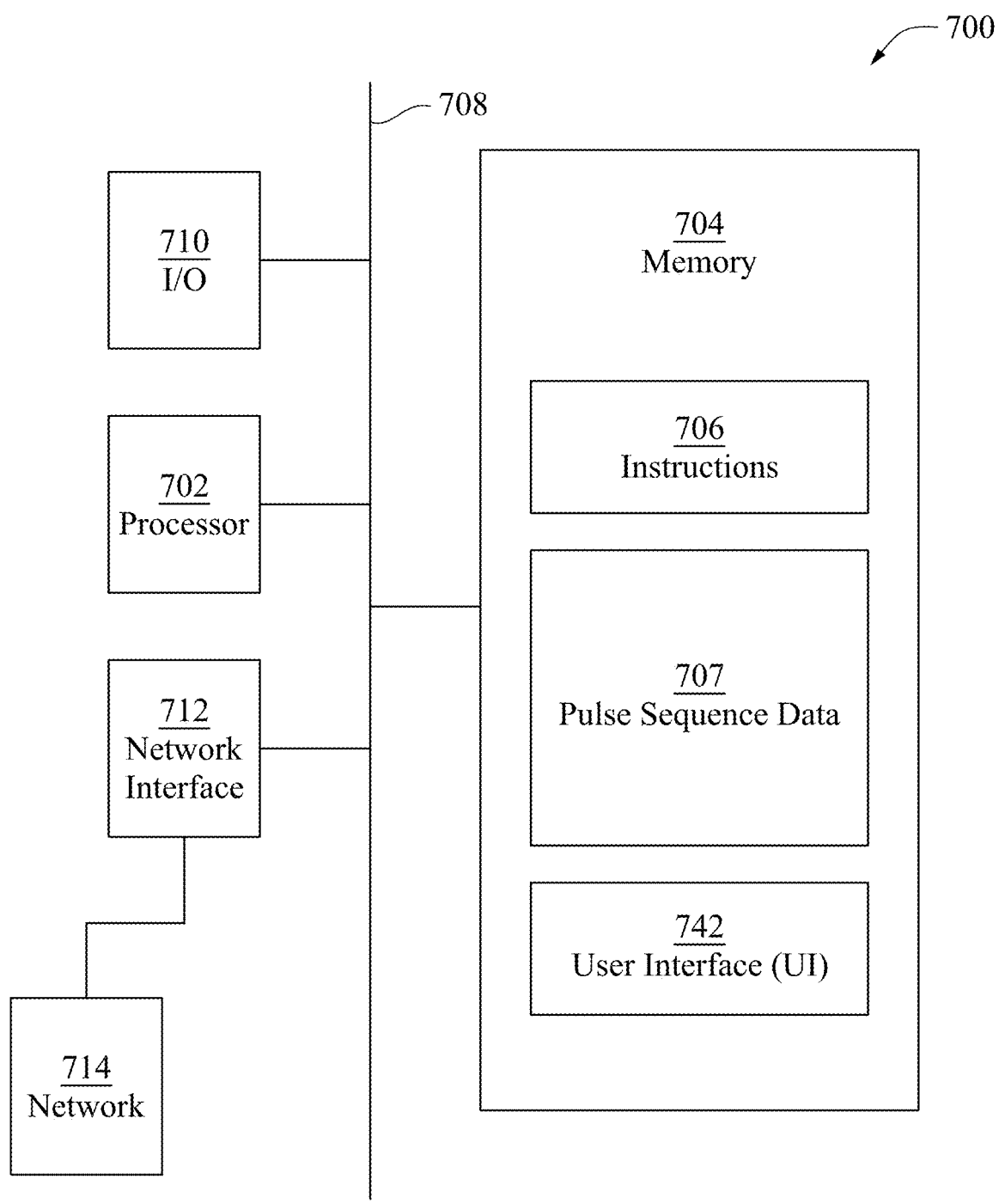
FIG. 7 is a block diagram of a pulse generation system, in accordance with some embodiments.

FIG. 7 is a block diagram of a pulse generation system 700, in accordance with some embodiments. Some or all of method 500 of altering a conductance of a PCM device, in accordance with one or more embodiments, is implementable, for example, using pulse generation system 700, in accordance with some embodiments.

In some embodiments, pulse generation system 700 is a general purpose computing device including a processor 702 and a non-transitory, computer-readable storage medium 704. Computer-readable storage medium 704, amongst other things, is encoded with, i.e., stores, computer program code 706, i.e., a set of executable instructions. Execution of computer program code 706 by processor 702 represents (at least in part) a pulse generation tool which implements a portion or all of a method according to an embodiment, e.g., method 500 described above with respect to FIG. 5 (hereinafter, the noted processes and/or methods).

Processor 702 is electrically coupled to computer-readable storage medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, computer-readable storage medium 704 stores computer program code 706 configured to cause pulse generation system 700 (where such execution represents (at least in part) the pulse generation tool) to be usable for performing a portion or all of the noted processes and/or methods. In one or more embodiments, computer-readable storage medium 704 also stores information which facilitates performing a portion or all of the noted processes and/or methods. In one or more embodiments, computer-readable storage medium 704 stores pulse sequence data 707 including pulse parameters, e.g., voltage and timing definitions corresponding to sequence of pulses Pn discussed above with respect to FIGS. 1-2D, and/or PCM device characterization data, e.g., as discussed above with respect to FIGS. 5-6B.

Pulse generation system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

Pulse generation system 700 also includes network interface 712 coupled to processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

Pulse generation system 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. Pulse generation system 700 is configured to receive information related to a UI through I/O interface 710. The information is stored in computer-readable storage medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of a pulse generation tool. In some embodiments, a portion or all of the noted processes and/or methods is implemented as a software application that is used by pulse generation system 700.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

By being configured to execute some or all of the operations of a method, e.g., method 500, pulse generation system 700 is capable of altering a conductance level of a PCM device by applying a sequence of pulses having trailing edge durations longer than leading edge durations, thereby controlling the PCM device conductance level so as to realize the benefits discussed above with respect to sequence of pulses Pn.

In some embodiments, a method of altering a conductance of a PCM device includes applying a pulse sequence to the PCM device, each pulse of the pulse sequence including a pulse number, an amplitude, a leading edge, a pulse width, and a trailing edge, the trailing edge having a duration longer than a duration of the leading edge, and, in response to applying the pulse sequence, altering a conductance level of the PCM device. Applying the pulse sequence includes increasing the pulse number while increasing at least one of the amplitude, the pulse width, or the trailing edge duration. In some embodiments, applying the pulse sequence to the PCM device includes applying the pulse sequence to a material layer of the PCM device. In some embodiments, applying the pulse sequence includes applying each pulse having the corresponding trailing edge duration corresponding to a crystallization temperature of the material layer. In some embodiments, altering the conductance level of the PCM device includes lowering the conductance level of the PCM device. In some embodiments, increasing the at least one of the amplitude, the pulse width, or the trailing edge duration includes increasing the amplitude linearly with respect to the pulse number. In some embodiments, increasing the at least one of the amplitude, the pulse width, or the trailing edge duration includes increasing the pulse width linearly with respect to the pulse number. In some embodiments, increasing the at least one of the amplitude, the pulse width, or the trailing edge duration includes increasing the trailing edge duration linearly with respect to the pulse number. In some embodiments, altering the conductance level of the PCM device includes decreasing a value of a ratio of a crystalline phase of a material layer to an amorphous phase of the material layer. In some embodiments, altering the conductance level of the PCM device includes altering a weight of an analog synapse. In some embodiments, the method includes performing a read operation after each pulse of the pulse sequence.

In some embodiments, a circuit includes a pulse generation circuit configured to output a pulse sequence, wherein each pulse of the pulse sequence includes a pulse number, at least one of an amplitude, a pulse width, or a trailing edge duration having a value that increases with the pulse number, and the trailing edge duration longer than a duration of a leading edge of the pulse. The circuit includes a PCM device configured to, responsive to the pulse sequence, reset from a first phase configuration having a first conductance value to a second phase configuration having a second conductance value. In some embodiments, the PCM device includes a PCM material, the first conductance value corresponds to a first value of a ratio of a crystalline phase of the PCM material to an amorphous phase of the PCM material, and the second conductance value corresponds to a second value of the ratio less than the first value of the ratio. In some embodiments, the PCM material includes a compound including two or more of germanium, antimony, or tellurium. In some embodiments, the PCM device includes a first analog synapse of a synapse array. In some embodiments, the pulse generation circuit includes a second analog synapse of the synapse array. In some embodiments, the PCM device comprises first and second electrodes configured to receive the pulse sequence, the first and second electrodes having a pillar or mushroom arrangement.

In some embodiments, a pulse generation system includes a processor and a non-transitory, computer readable storage medium including computer program code for one or more programs. The non-transitory, computer readable storage medium and the computer program code are configured to, with the processor, cause the pulse generation system to define a pulse sequence having a number of pulses N, and, for each pulse of the pulse sequence, define a trailing edge having a duration longer than a duration of a leading edge, cause the pulse to be applied to a PCM device, and perform a read operation to determine a conductance value of the PCM device. In some embodiments, the non-transitory, computer readable storage medium and the computer program code are configured to, with the processor, further cause the pulse generation system to define the pulse sequence having the number of pulses N ranging from 20 to 80. In some embodiments, the non-transitory, computer readable storage medium and the computer program code are configured to, with the processor, further cause the pulse generation system to define the trailing edge duration of each pulse based on a crystallization temperature of a material layer of the PCM device. In some embodiments, each pulse of the pulse sequence includes a pulse number n ($1 \leq n \leq N$), and the non-transitory, computer readable storage medium and the computer program code are configured to, with the processor, further cause the pulse generation system to define values of at least one of an amplitude, a pulse width, or the trailing edge duration of each pulse that increase as a linear function of the pulse number n.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of altering a conductance of a phase-change memory (PCM) device, the method comprising:
    applying a pulse sequence to the PCM device, each pulse of the pulse sequence comprising a pulse number, an amplitude, a leading edge, a pulse width, and a trailing edge, the trailing edge having a duration longer than a duration of the leading edge; and
    in response to the applying the pulse sequence, altering a conductance level of the PCM device,
    wherein the applying the pulse sequence comprises increasing the pulse number while increasing at least one of the amplitude, the pulse width, or the trailing edge duration.

2. The method of claim 1, wherein the applying the pulse sequence to the PCM device
    comprises applying the pulse sequence to a material layer of the PCM device.

3. The method of claim 2, wherein the applying the pulse sequence comprises applying each pulse having the corresponding trailing edge duration corresponding to a crystallization temperature of the material layer.

4. The method of claim 1, wherein the altering the conductance level of the PCM device comprises lowering the conductance level of the PCM device.

5. The method of claim 1, wherein the increasing the at least one of the amplitude, the pulse width, or the trailing edge duration comprises increasing the amplitude wherein the amplitude is increased linearly with respect to the pulse number.

6. The method of claim 1, wherein the increasing the at least one of the amplitude, the pulse width, or the trailing edge duration comprises increasing the pulse width wherein the pulse width is increased linearly with respect to the pulse number.

7. The method of claim 1, wherein the increasing the at least one of the amplitude, the pulse width, or the trailing edge duration comprises increasing the trailing edge duration wherein the trailing edge duration is increased linearly with respect to the pulse number.

8. The method of claim 1, wherein the altering the conductance level of the PCM device comprises decreasing a value of a ratio of a crystalline phase of a material layer to an amorphous phase of the material layer.

9. The method of claim 1, wherein the altering the conductance level of the PCM device comprises altering a weight of an analog synapse.

10. The method of claim 1, further comprising performing a read operation after each pulse of the pulse sequence.

11. A circuit comprising:
    a pulse generation circuit configured to output a pulse sequence, wherein each pulse of the pulse sequence comprises:
        a pulse number;
        at least one of an amplitude, a pulse width, or a trailing edge duration having a value that increases with the pulse number; and
        the trailing edge duration longer than a duration of a leading edge of the pulse; and
    a phase-change memory (PCM) device configured to, responsive to the pulse sequence, reset from a first phase configuration having a first conductance value to a second phase configuration having a second conductance value.

12. The circuit of claim 11, wherein
    the PCM device comprises a PCM material,
    the first conductance value corresponds to a first value of a ratio of a crystalline phase of the PCM material to an amorphous phase of the PCM material, and
    the second conductance value corresponds to a second value of the ratio less than the first value of the ratio.

13. The circuit of claim 12, wherein the PCM material comprises a compound comprising two or more of germanium, antimony, or tellurium.

14. The circuit of claim 11, wherein the PCM device comprises a first analog synapse of a synapse array.

15. The circuit of claim 14, wherein the pulse generation circuit comprises a second analog synapse of the synapse array.

16. The circuit of claim 11, wherein the PCM device comprises first and second electrodes configured to receive the pulse sequence, the first and second electrodes having a pillar or mushroom arrangement.

17. A pulse generation system comprising:
    a processor; and a non-transitory, computer readable storage medium including computer program code for one or more programs, the non-transitory, computer readable storage medium and the computer program code being configured to, with the processor, cause the system to:
define a pulse sequence having a number of pulses N; and
for each pulse of the pulse sequence:
    define a trailing edge having a duration longer than a duration of a leading edge;
    apply the pulse sequence by increasing the pulse number while increasing at least one of a pulse amplitude, a pulse width, or the trailing edge duration;
    cause the pulse to be applied to a phase-change memory (PCM) device; and
    perform a read operation to determine a conductance value of the PCM device.

18. The pulse generation system of claim 17, wherein the computer readable storage medium and the computer program code are configured to, with the processor, further cause the system to define the pulse sequence having the number of pulses N ranging from 20 to 80.

19. The pulse generation system of claim 17, wherein the computer readable storage medium and the computer program code are configured to, with the processor, further cause the system to define the trailing edge duration of each pulse based on a crystallization temperature of a material layer of the PCM.

20. The pulse generation system of claim 17, wherein
each pulse of the pulse sequence comprises a pulse number n, wherein ($1 \leq n \leq N$), and
the computer readable storage medium and the computer program code are configured to, with the processor, further cause the system to define values of at least one of the pulse amplitude, the pulse width, or the trailing edge duration of each pulse that increase as a linear function of the pulse number n.

* * * * *